US012525420B2

(12) United States Patent
Liu et al.

(10) Patent No.: US 12,525,420 B2
(45) Date of Patent: *Jan. 13, 2026

(54) CHARGED PARTICLE BEAM SOURCE

(71) Applicant: FEI Company, Hillsboro, OR (US)

(72) Inventors: Kun Liu, Portland, OR (US); Steven J. Randolph, Portland, OR (US)

(73) Assignee: FEI Company, Hillsboro, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/836,611

(22) Filed: Jun. 9, 2022

(65) Prior Publication Data

US 2023/0011267 A1 Jan. 12, 2023

Related U.S. Application Data

(63) Continuation of application No. 16/828,571, filed on Mar. 24, 2020, now Pat. No. 11,380,511.

(51) Int. Cl.

*H01J 37/075* (2006.01)

*H01J 37/28* (2006.01)

(52) U.S. Cl.

CPC ............ *H01J 37/075* (2013.01); *H01J 37/28* (2013.01)

(58) Field of Classification Search

None

See application file for complete search history.

(56) References Cited

U.S. PATENT DOCUMENTS 3,928,783 A * 12/1975 Hosoki ..................... H01J 1/20 313/305
4,054,946 A 10/1977 Ferris et al.
4,055,780 A * 10/1977 Kawai ..................... H01J 1/148 252/521.1
4,258,283 A 3/1981 Brunger et al.
(Continued)

FOREIGN PATENT DOCUMENTS

CN 109769391 A 5/2019
EP 2680294 A1 * 1/2014 ............ B82Y 10/00
(Continued)

OTHER PUBLICATIONS

Extended European Search Report, issued in related European Patent Application No. 21163852.3 by the European Patent Office on Aug. 18, 2021, 14 pages.
(Continued)

*Primary Examiner* — Andrew Smyth
(74) *Attorney, Agent, or Firm* — Klarquist Sparkman, LLP

(57) ABSTRACT

A charged particle beam source, such as for use in an electron microscope, can include a mounting member defining a first opening at a free end of the mounting member and a bore extending from the first opening into the mounting member along a longitudinal axis of the mounting member. A second opening can be defined in a side wall of the mounting member and can extend between an outer surface of the mounting member and the bore, the second opening being spaced apart from the first opening along the longitudinal axis of the mounting member. An emitter member can be received in the bore and aligned along the longitudinal axis of the mounting member. A fixative material can be received in the bore and in the second opening to retain the emitter member in the bore.

20 Claims, 9 Drawing Sheets

(56) References Cited

U.S. PATENT DOCUMENTS

| | | | | | |
|---|---|---|---|---|---|
| 4,740,705 | A * | 4/1988 | Crewe | H01J 37/073 313/310 |
| 5,442,674 | A | 8/1995 | Picard et al. | |
| 5,838,096 | A * | 11/1998 | Shinada | H01J 1/15 313/309 |
| 5,963,612 | A | 10/1999 | Navab | |
| 5,963,613 | A | 10/1999 | Navab | |
| 6,044,132 | A | 3/2000 | Navab | |
| 6,049,582 | A | 4/2000 | Navab | |
| 6,731,283 | B1 | 5/2004 | Navab | |
| 6,753,828 | B2 | 6/2004 | Tuceryan et al. | |
| 8,878,422 | B2 | 11/2014 | Mattausch et al. | |
| 8,896,195 | B2 | 11/2014 | Dou | |
| 8,952,605 | B2 | 2/2015 | Zhang et al. | |
| 10,707,046 | B2 | 7/2020 | Kusunoki et al. | |
| 11,380,511 | B2 * | 7/2022 | Liu | H01J 37/28 |
| 2002/0105484 | A1 | 8/2002 | Navab et al. | |
| 2002/0113756 | A1 | 8/2002 | Tuceryan et al. | |
| 2010/0301736 | A1 * | 12/2010 | Morishita | H01J 37/06 445/51 |
| 2013/0121457 | A1 | 5/2013 | Maltz et al. | |
| 2013/0161520 | A1 | 6/2013 | Jansen | |
| 2015/0357147 | A1 * | 12/2015 | Yasaka | H01J 3/04 313/35 |
| 2019/0066966 | A1 * | 2/2019 | Kusunoki | H01J 37/073 |
| 2019/0172674 | A1 | 6/2019 | Dou et al. | |
| 2019/0385809 | A1 | 12/2019 | Kusunoki et al. | |

FOREIGN PATENT DOCUMENTS

| | | | | | |
|---|---|---|---|---|---|
| EP | 2680294 | A4 * | 10/2014 | B82Y 10/00 |
| EP | 2680294 | B1 * | 9/2015 | B82Y 10/00 |
| GB | 1527022 | A * | 10/1978 | H01J 37/073 |
| JP | S5264268 | A | 5/1977 | |
| JP | 62140331 | A * | 6/1987 | |
| JP | S62 140331 | A | 6/1987 | |
| JP | S647450 | A | 1/1989 | |
| JP | S6454636 | A | 3/1989 | |
| JP | 2809264 | B2 | 10/1998 | |
| JP | 2004079223 | A * | 3/2004 | H01J 37/26 |
| JP | 3832402 | B2 * | 10/2006 | B82Y 30/00 |
| JP | 2011065790 | A | 3/2011 | |
| JP | 2016110748 | A * | 6/2016 | |
| JP | 2017157368 | A | 9/2017 | |

OTHER PUBLICATIONS

Zhang et al., "An ultrabright and monochromatic electron point source made of a LaB6 nanowire," Nature Nanotechnology 11(3): 273-279 (Nov. 30, 2015.).

Notice of Reason for Rejection issued in Korean Application No. 10-2023-0131833 by the Korean Intellectual Property Office on Nov. 27, 2024, 8 pages (with English translation, 11 pages).

Notice of Allowance of Patent issued in Korean Application No. 10-2023-131833 by the Korean Intellectual Property Office on Aug. 21, 2025, with English translation (9 pages).

* cited by examiner

CHARGED PARTICLE BEAM SOURCE

CROSS REFERENCE TO RELATED APPLICATION

The present application is a continuation of U.S. application Ser. No. 16/828,571, filed Mar. 24, 2020, which is incorporated herein by reference in its entirety.

FIELD

The present disclosure pertains to charged particle beam sources such as electron beam sources, and systems and methods of manufacturing the same.

BACKGROUND

Charged particle beam (CPB) sources such as those used in scanning and/or transmission electron microscopes typically include a beam-generating element such as a filament which, when electrically biased and/or thermally heated (e.g., for Schottky emitters), emits a beam of charged particles. Such filaments are typically made from metallic materials such as crystalline tungsten or rhenium, compound materials such as lanthanum hexaboride ($LaB_6$) or cerium hexaboride ($CeB_6$), and/or other materials which have low work functions. However, coupling filaments made of low workfunction compound materials to a heating element such as a tungsten hairpin can be problematic because the materials typically cannot be attached by electrical spot welding. Thus, existing CPB sources made from compound materials typically rely on frictional engagement or the application of compressive force to the emitter filament by portions of the heating element structure, such as by clamping the filament between graphite sheets in a Vogel mount. Other approaches include securing the filament by focused ion beam (FIB) welding when the thickness of the emitter filament is of nanometer to micrometer thickness. In each of these approaches, precisely aligning the emitter filament is difficult and time consuming. Vogel mounts also typically require relatively high electrical heating currents to clean the emitter and/or to initiate beam generation during source operation, which can introduce, for example, thermal stability problems. FIB welding is time consuming, technically complex, and typically must be carried out under vacuum, resulting in relatively high production cost and low productivity. Accordingly, there exists a need for improved CPB source structures and manufacturing techniques.

SUMMARY

Certain embodiments of the disclosure pertain to charged particle beam sources or modules for use in charged particle beam systems such as electron microscopes. In a representative embodiment, a charged particle beam source comprises an electrically conductive support member coupled to a base, a mounting member coupled to the support member and defining a bore, and an emitter member received in the bore and retained by a fixative material layer flowed around the emitter member in the bore.

In any or all of the disclosed embodiments, the mounting member defines a longitudinal axis, and the bore extends along the longitudinal axis.

In any or all of the disclosed embodiments, the mounting member comprises an opening along its length that is longitudinally offset from a free end portion of the mounting member, and the opening being in communication with the bore. Fixative material of the fixative material layer is received in the opening.

In any or all of the disclosed embodiments, the opening is a channel formed in the mounting member.

In any or all of the disclosed embodiments, the mounting member comprises a plurality of channels spaced apart along its length and a plurality of retaining portions that extend around the emitter member.

In any or all of the disclosed embodiments, the mounting member comprises a first end portion coupled to the support member, the free end portion is a free second end portion, and the opening is offset from the free second end portion toward the first end portion.

In any or all of the disclosed embodiments, the emitter member comprises lanthanum hexaboride ($LaB_6$) or cerium hexaboride ($CeB_6$), or other emitter materials that are not spot-weldable.

In any or all of the disclosed embodiments, the fixative material layer is formed from a dispersed phase of a colloidal liquid.

In any or all of the disclosed embodiments, the fixative material layer comprises graphite.

In any or all of the disclosed embodiments, the charged particle beam source is configured as an electron beam source.

In any or all of the disclosed embodiments, the emitter member is not clamped by other components of the charged particle beam source.

In another representative embodiment, a scanning electron microscope can comprise the charged particle beam source of any or all of the disclosed embodiments.

In another representative embodiment, a method of making a charged particle beam source comprises forming the bore in the mounting member, inserting the emitter member into the bore in the mounting member, and flowing a colloidal liquid around the emitter member and the mounting member to form the fixative material layer.

In another representative embodiment, a method of using a charged particle beam source comprises heating the emitter member to generate a charged particle beam, and directing the charged particle beam at a target.

In another representative embodiment, a charged particle beam source comprises an electrically conductive support member coupled to a base, a mounting member coupled to the support member and defining a bore, and an emitter member received in the bore, wherein the mounting member comprises a retaining portion that extends around the emitter member.

In any or all of the disclosed embodiments, the emitter member is retained in the bore by a fixative material layer flowed around the emitter member in the bore.

In any or all of the disclosed embodiments, the fixative material layer is formed from a dispersed phase of a colloidal liquid.

In any or all of the disclosed embodiments, the charged particle beam source can further comprise a channel defined between the retaining portions.

In any or all of the disclosed embodiments, the bore and the emitter member each comprise a rectangular cross section.

In another representative embodiment, a charged particle beam source comprises an electrically conductive support member coupled to a base, a mounting member coupled to the support member and defining a bore, and an emitter member received in the bore and retained in the bore by a fixative material layer, wherein a cross-section of the bore is larger than a cross-section of the emitter member.

In any or all of the disclosed embodiments, the emitter member is not clamped by the mounting member.

The foregoing and other objects, features, and advantages of the disclosed technology will become more apparent from the following detailed description, which proceeds with reference to the accompanying figures.

DETAILED DESCRIPTION

The present disclosure concerns embodiments of charged particle beam (CPB) sources, such as electron beam sources, field emitters, electron guns, etc., and systems and methods for their manufacture. The CPB sources disclosed herein are discussed in the context of CPB systems such as CPB microscopes, but can be useful in other applications as well such as electron holography, x-ray sources, planar displays, jet propulsion, etc. The CPB sources described herein can include a conductive (e.g., metallic) support member such as a tungsten hairpin coupled to a pair of electrodes, and a metallic (e.g., tungsten) mounting member coupled to and extending from an apex of the support member. The mounting member can define an axial bore in which an emitter member such as a $LaB_6$ or $CeB_6$ filament is received. The mounting member can further define at least one opening, aperture, or channel in the side of the mounting member and axially offset from the free end of the mounting member. The emitter member can be retained in the bore of the mounting member by a fixative material layer that is flowed around the mounting member, through the at least one channel, and into the bore such that the internal surfaces of the bore, the corresponding surfaces of the emitter member, and/or the exterior surfaces of the mounting member are coated by the fixative material layer. The CPB sources disclosed herein can provide improved alignment of the beam-generating emitter with the optical axis of the CPB system, as well as stable and reliable operation for long time periods at elevated temperature without significant degradation, and without the need to clamp or hold the emitter member in place with compressive force applied by other elements of the structure.

Example 1

Figure 1:
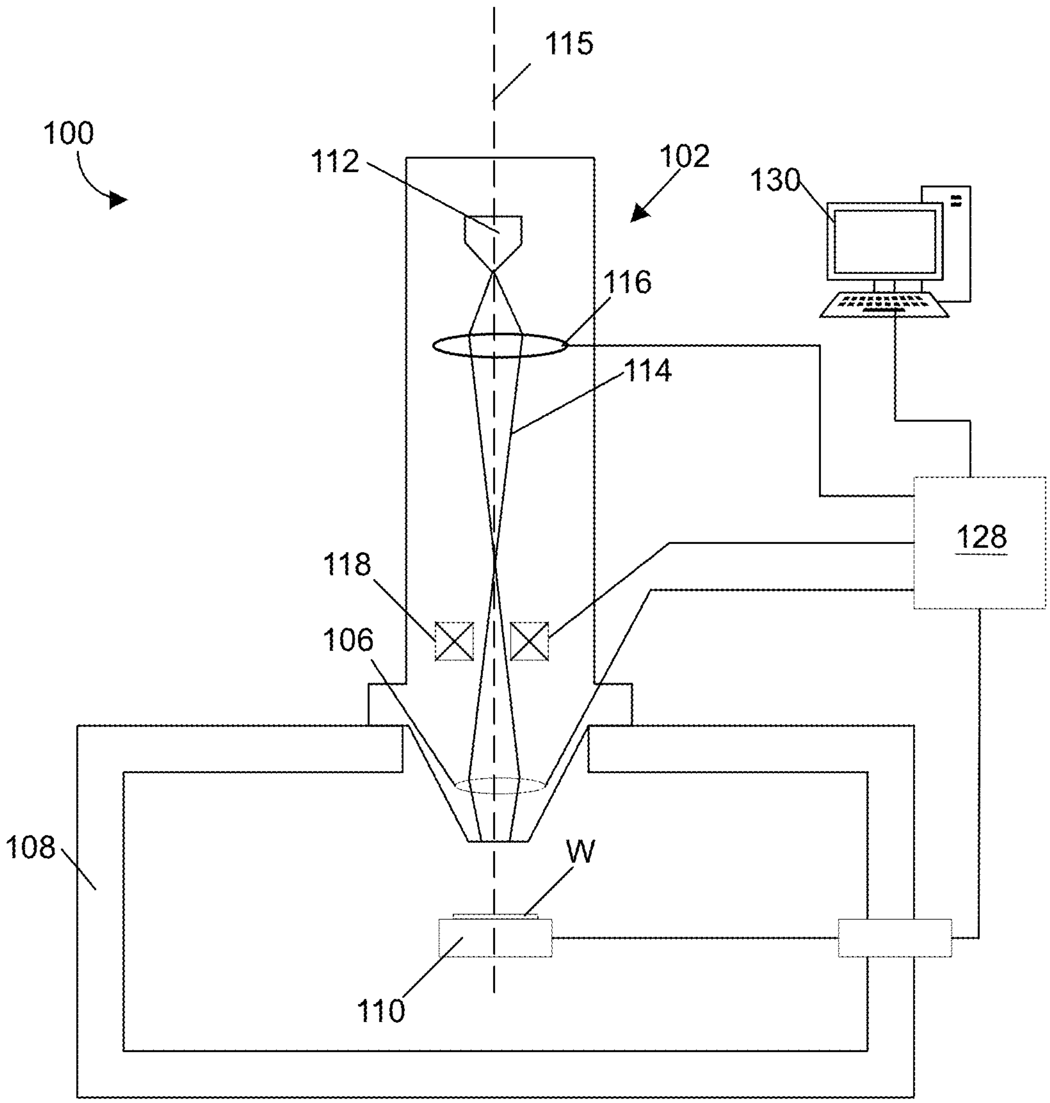
FIG. 1 is a schematic diagram of a representative embodiment of a charged particle beam system, according to one embodiment.

FIG. 1 illustrates a representative embodiment of a charged particle beam (CPB) system 100 comprising a beam column 102. The beam column 102 can be, for example, a charged particle microscope, such as a scanning electron microscope (SEM), a transmission electron microscope (TEM), or a combination scanning and transmission electron microscope (STEM). In the illustrated embodiment, for ease of reference and without limitation, the beam column 102 is configured as a scanning electron microscope (SEM). The SEM 102 can comprise one or more CPB lenses such as a condenser lens 116 and an objective lens 106. In some embodiments, one or more CPB lenses can be magnetic lenses, and particularly, the objective lens 106 can be a magnetic objective lens. The SEM 102 is situated for production of an image of a target or workpiece W.

The SEM 102 can be mounted to or in a vacuum chamber 108 housing a positioning system 110 for holding and moving the workpiece W. The vacuum chamber 108 can be evacuated using vacuum pumps (not shown).

The SEM 102 can comprise a CPB source 112, which can be configured according to any of the CPB source embodiments described herein. The SEM 102 can be configured to manipulate a "raw" radiation beam from the CPB source 112 and perform upon it operations such as focusing, aberration mitigation, cropping (using an aperture), filtering, scanning, etc. For example, the CPB source 112 can produce a beam 114 of input charged particles (e.g., an electron beam) that propagates along a particle-optical axis 115. The SEM 102 can generally comprise one or more lenses (e.g., CPB lenses) such as the condenser lens 116 and the objective lens 106 to focus the beam 114 onto the workpiece W. In some embodiments, the SEM 102 can be provided with a deflection unit 118 that can be configured to steer the beam 114. For example, the beam 114 can be steered in a scanning motion (e.g., a raster or vector scan) across a sample being investigated or a workpiece to be processed. In certain examples, additional CPB components such as other lenses, deflectors, stigmators, and/or apertures are used, but are not shown for convenient illustration.

The CPB system 100 can further comprise a computer processing apparatus and/or a controller 128 for controlling, among other things, the deflection unit 118, charged particle beam (CPB) lenses 106, 116, the positioning system 110, and detectors (not shown), and for displaying information gathered from the detectors on a display unit such as images of a workpiece or portions thereof, position information, or system control data. In some cases, a control computer 130 is provided to establish various excitations, record imaging data, and generally control operation of the SEM, the positioning system, etc.

Example 2

Figure 2:
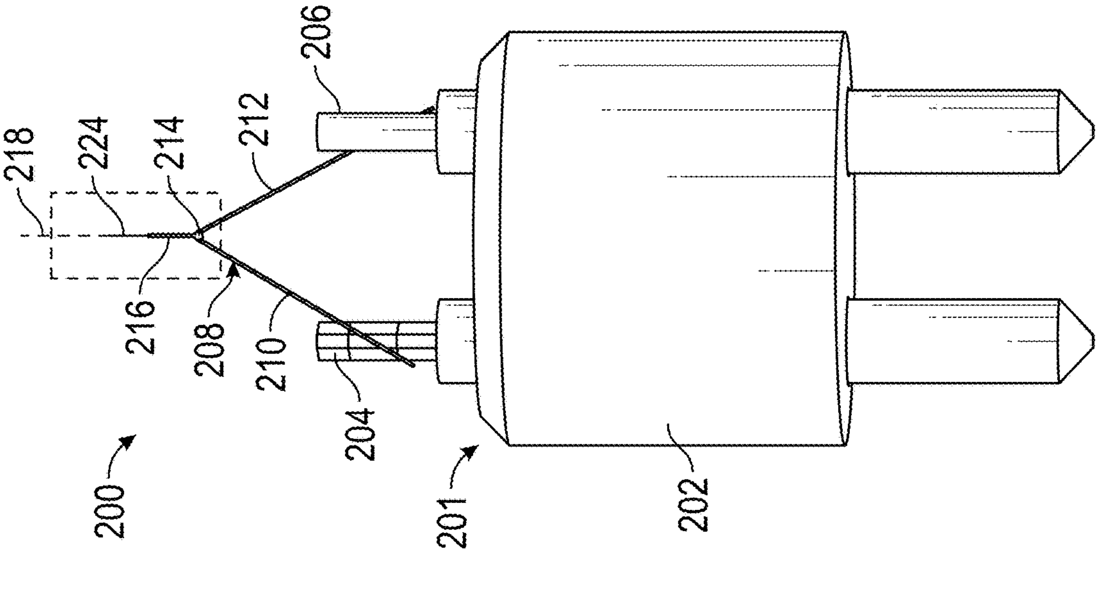
FIG. 2 is a side elevation view of a charged particle beam source, according to one embodiment.
Figure 3:
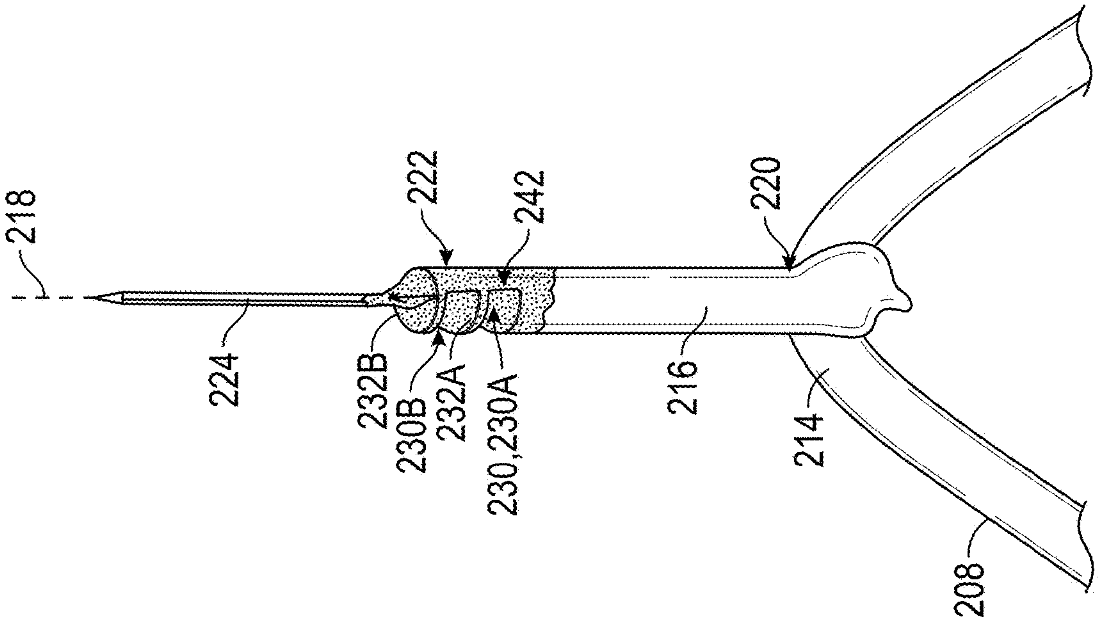
FIG. 3 is a magnified perspective view of a mounting member and an emitter member of the charged particle beam source of FIG. 2.

FIGS. 2 and 3 illustrate a charged particle beam (CPB) source component, module, or assembly 200, according to one embodiment. The CPB source 200 can comprise base 201 comprising an insulative main body 202 and two electrodes 204 and 206 positioned or embedded within the insulative body 202. In certain embodiments, the insulative body 202 can comprise a high temperature insulating material, such as any of various ceramic materials (e.g., alumina, boron nitride, glass, machinable glass ceramic, etc.)

The CPB source 200 can further comprise a curved or angled support member 208 (also referred to as a "hairpin") interconnecting the two electrodes 204 and 206 on one side of the insulative body 202. In the illustrated embodiment, the support member 208 can comprise a first portion 210 and a second portion 212 coupled together at an apex 214. The first portion 210 of the support member 208 can be coupled or electrically connected to the electrode 204, and the second portion 212 of the support member can be coupled or electrically connected to the electrode 206. In certain examples, the first and second portions 210 and 212 can be coupled on opposite sides of the respective electrodes 204 and 206 (e.g., to points on the surfaces of the cylindrical electrodes that are circumferentially offset by 180°) so as to align the apex 214 with the longitudinal axis of the insulative body 202 (e.g., the axis 218). However, in other embodiments the portions 210 and 212 can be coupled on the same sides of the electrodes as each other depending upon the particular requirements of the system.

The CPB source 200 can further comprise a mounting member 216 coupled to and extending from the apex 214 of the support member 208. FIG. 3 illustrates the mounting member 216 in greater detail. In the illustrated embodiment, the mounting member 216 is configured as a cylindrical body including a first end portion 220 coupled to the apex 214 of the support member 208, and a free second end portion 222, although in other embodiments the mounting member may have any shape. The mounting member 216 can define a longitudinal axis 218. The mounting member 216 can be separately formed and attached to the support member 208 (e.g., by welding), or may be integrally formed with the support member such that the support member and the mounting member are a unitary construction. As used herein, the terms "integrally formed" and "unitary construction" refer to a construction that does not include any welds, fasteners, or other means for securing separately formed pieces of material to each other.

Figure 5:
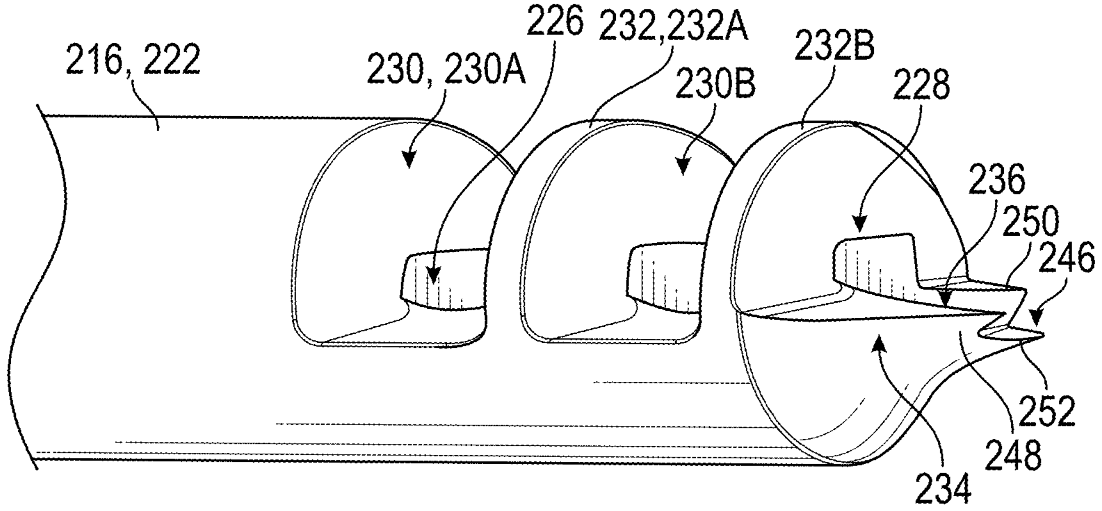
FIG. 5 is a magnified perspective view of a free end portion of the mounting member of FIG. 2 after formation of an axial bore and axially spaced channels, according to one embodiment.

Referring to FIG. 5, the mounting member 216 can further comprise a shaft/lumen/cavity/bore 226 formed in the mounting member, and extending from the free second end portion 222 in a direction along the longitudinal axis 218 (FIG. 3). For example, in the illustrated embodiment the bore 226 comprises an opening 228 at the free edge of the free second end portion 222, and can be configured to receive an emitter member or filament 224, as described further below. In certain embodiments, the bore 226 can extend along any portion of the length of the mounting member 216 depending upon, for example, the length of the emitter member 224. In the illustrated embodiment, the bore 226 has a rectangular cross-section corresponding to the rectangular cross-section of the emitter member 224, although in other embodiments the bore may have any cross-sectional shape such as a round or circular cross-section, depending upon the shape of the emitter.

In certain embodiments, the mounting member 216 can also comprise one or a plurality of openings spaced apart along its length and configured as channels/recesses/trenches/slots 230. The channels 230 can be formed in the second end portion 222 of the mounting member 216, and can extend at least partially through the cross-section of the mounting member. Referring to FIGS. 3 and 5, prior to the application of a fixative material layer 242 described in greater detail below, the channels 230 can be in fluid communication with the bore 226. In certain embodiments, the channels 230 can extend perpendicular to the longitudinal axis 218 (FIG. 3), and can be axially spaced apart from each other along the length of the mounting member 216.

In particular embodiments, the channels 230 can be formed in the free second portion 222. For example, in the illustrated embodiment the free second end portion 222 comprises two channels 230A and 230B axially spaced apart from each other along the longitudinal axis 218, and extending approximately halfway through the thickness of the mounting member. The free second end portion 222 can further comprise curved projections or extensions configured as retaining members/portions 232 disposed between sequential channels 230 and/or, in certain embodiments, at the end surface of the free second end portion 222. For example, in the embodiment illustrated in FIG. 5, the mounting member 216 comprises a curved retaining portion 232A between the channels 230A and 230B, and a curved retaining portion 232B located distally of the channel 230B. The bore 226 can extend through the retaining portions 232A and 232B.

Still referring to FIG. 5, in the illustrated embodiment the mounting member 216 can further comprise an extension portion or cradle portion 234 extending axially (e.g., distally) from the retaining portion 230B. The cradle portion 234 can define a longitudinally-extending recess or channel 236 that is axially aligned and in fluid communication with the bore 226 (at least prior to insertion of the emitter member 224 and application of the fixative material layer 242). In certain embodiments, the cradle portion 234 can comprise three axially-extending, pointed projections 248, 250, and 252, which together can define a notch 246.

Figure 14:
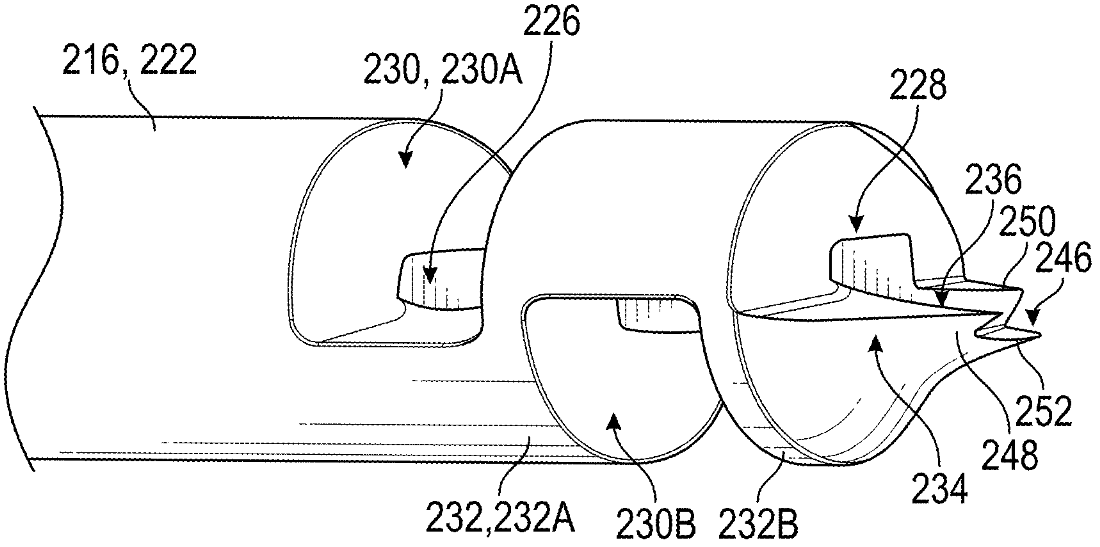
FIG. 14 is a magnified perspective view of the free end portion of the mounting member of FIG. 2 comprising two channels circumferentially offset from each other.
Figure 15:
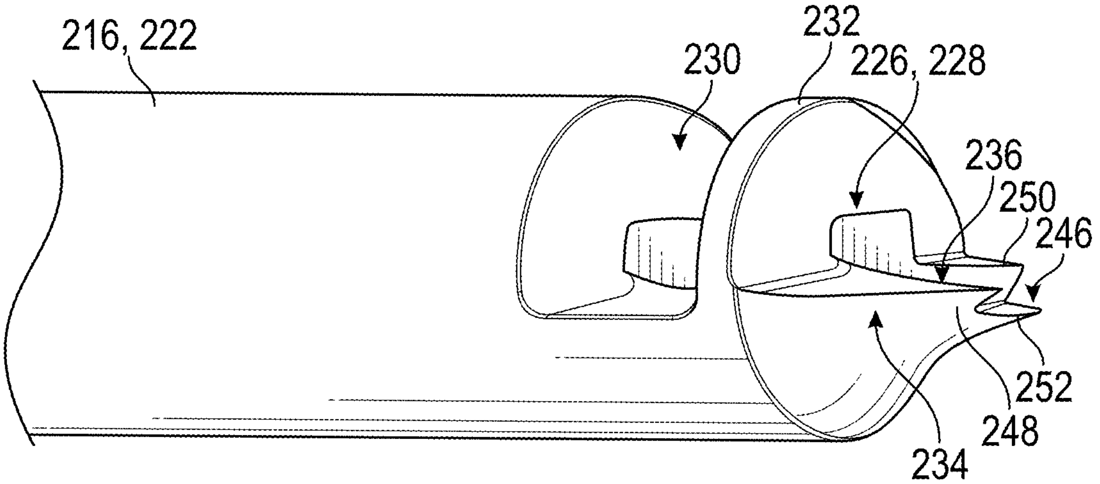
FIG. 15 is a magnified perspective view of the free end portion of the mounting member of FIG. 2 including a single channel.
Figure 16:
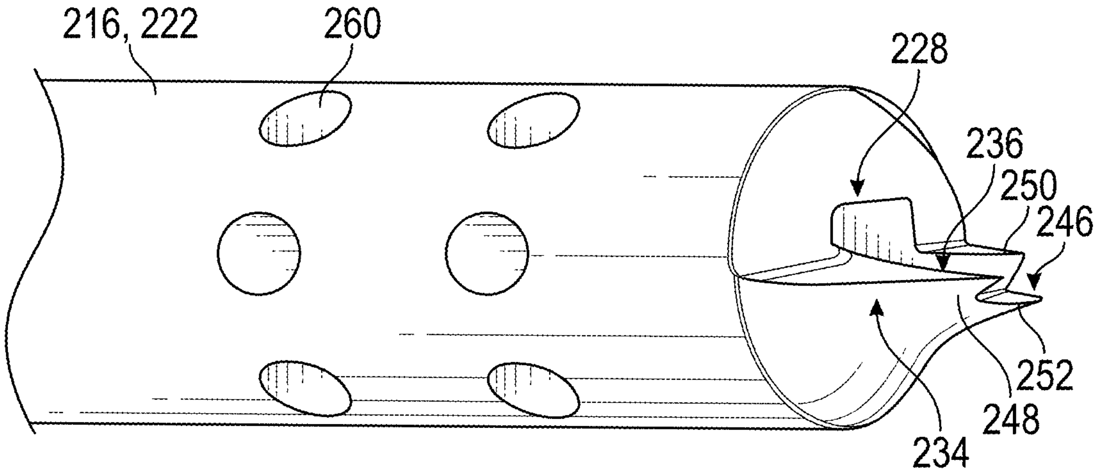
FIG. 16 is a magnified perspective view of the free end portion of the mounting member of FIG. 2 including a plurality of circular openings.

In certain embodiments, the channels 230 may be circumferentially aligned with each other, as in the illustrated embodiment, or may be circumferentially offset. For example, in certain embodiments the channels 230 can be formed anywhere around the circumference of the mounting member 216, and may have any angular spacing. For example, FIG. 14 illustrates another example in which the channels 230A and 230B are circumferentially offset from each other by 180°. The channels 230 can also be formed with a uniform axial spacing, as illustrated, or with different axial spacing between channels, depending upon the particular requirements of the system. The channels 230 can also have any width as measured in the axial direction, and can extend around any proportion of the circumference of the mounting member. The channels also need not have the same width or circumferential length. In other embodiments, the mounting member can include only a single channel 230, as illustrated in FIG. 15. In yet other embodiments, the channels 230 can be openings or apertures of any size and/or shape in fluid communication with the bore 226, and can be formed in any number and at any position along and/or around the mounting member 216 to admit fixative into the bore. For example, FIG. 16 illustrates the mounting member 216 including a plurality of round apertures 260, which can be angularly and longitudinally aligned with each other as shown, or angularly and/or longitudinally offset in any arrangement. The mounting member can also include multiple rows or bands of such apertures 260 axially spaced apart along the mounting member. In still other embodiments, the emitter member 224 can be received in a bore formed in the support member 208, for example, at the apex, and need not include a mounting member.

As noted above, the CPB source can further comprise an emitter member 224 coupled to the mounting member 216. More particularly, a base or first end portion 238 (FIG. 6) of the emitter member 224 can be received in the bore 226 of the mounting member 216, and the emitter member can extend axially from the free second end portion 222 of the mounting member in a direction along the longitudinal axis 218 (FIG. 3). In certain embodiments, the tip or free end portion of the emitter member 224 can be sharp or pointed. In the illustrated embodiment, the emitter member 224 has a rectangular cross-section corresponding to the rectangular bore 226, although the emitter member 224 and bore 226 may have any cross-sectional shape.

The emitter member 224 can comprise any of a variety of materials exhibiting a relatively low workfunction (e.g., 2.93 eV or less, such as 2.6 eV or less). Exemplary materials can include crystalline lanthanum hexaboride ($LaB_6$), cerium hexaboride ($CeB_6$), crystalline tungsten (e.g., W(100)), ZrO-coated crystalline tungsten, single-walled carbon nanotubes, multi-walled carbon nanotubes, carbon nano cones, ZnO nanobelts, WOx nanowire or other metallic nanowires, etc.

Figure 11:
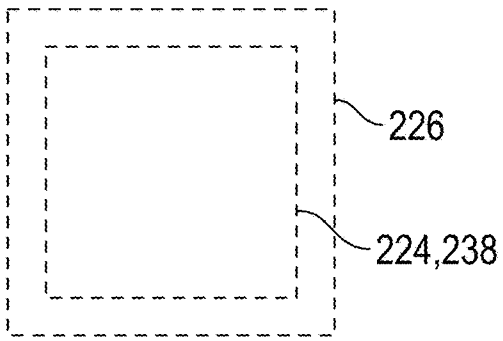
FIG. 11 is a schematic diagram illustrating the cross-section of the emitter member of FIG. 2 superimposed over the cross-section of the bore in the mounting member.

In certain embodiments, although the emitter member 224 and the bore 226 have the same cross-sectional shape, the cross-section (e.g., the cross-sectional area) of the bore 226 can be larger than the cross-section (e.g., the cross-sectional area) of the first end portion 238 of the emitter member. This is illustrated in FIG. 11, in which the cross-section of the first end portion 238 of the emitter member 224 is shown schematically superimposed on the cross-section of the bore 226. Accordingly, before fixation or attachment of the emitter member 224 to the mounting member 216, the emitter member can be freely movable longitudinally relative to the mounting member within the bore 226. Thus, unlike existing Vogel-type CPB sources, in the illustrated embodiment the mounting member 216 does not clamp or apply compressive force to the emitter member 224 to hold the emitter member in place.

Figure 7:
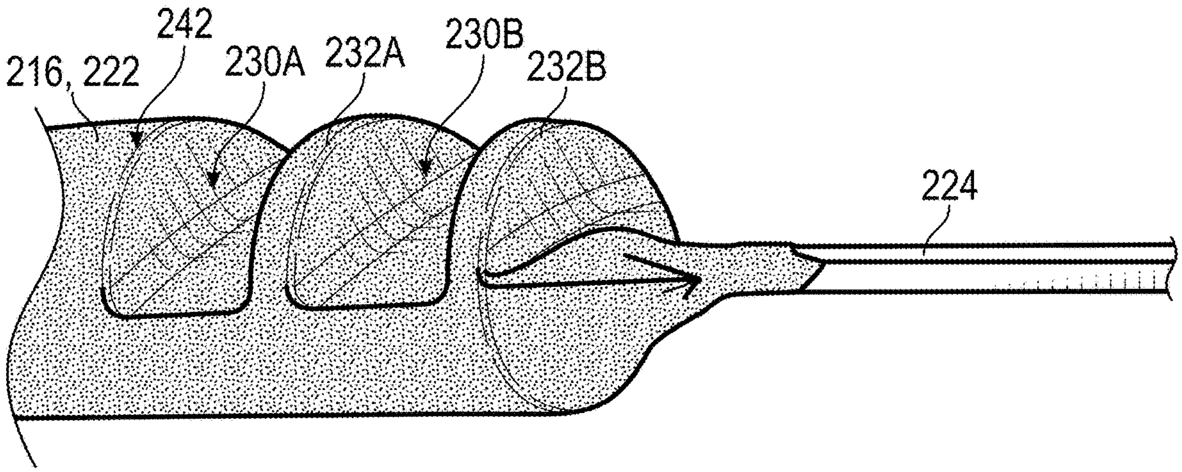
FIG. 7 is a magnified perspective view of the free end portion of the mounting member of FIG. 2 illustrating a fixative material layer applied to secure the emitter member in the bore.

Accordingly, a fixative material, binder, or fixation or binder means can be used to secure the emitter member 224 in place within the bore 226. In certain embodiments, the fixative material can be in the form of a layer of material that fixes/binds/secures/couples/attaches the emitter member 224 to the mounting member 216, and is referred to herein as a fixative material layer 242 (FIGS. 3 and 7). In certain embodiments, the fixative material layer 242 can be a material applied in a liquid or flowable state, such as the dispersed phase of a colloidal liquid or sol. In particular embodiments, the fixative material layer 242 can comprise a layer of graphite left behind after the evaporation of the liquid phase or media of a colloidal graphite mixture. In certain embodiments, the fixative material layer 242 can extend at least partially around the perimeter of the emitter member 224 in the bore 226, and/or around the exterior of the mounting member 216, to bond or secure the emitter member 224 in place in the bore.

Exemplary materials which can be used to form the fixative material layer 242 include graphite, graphene, Bucky balls (e.g., $C_{60}$), carbon nanotubes, amorphous carbon, etc. Such materials may be applied as part (e.g., the dispersed phase) of a colloidal mixture where the liquid phase comprises any of water (e.g., an aqueous colloidal mixture), alcohol (e.g., isopropanol), acetone, etc. In other embodiments, the emitter member 224 can be secured in place using other materials with relatively high melting temperatures, including tungsten, rhenium, molybdenum, tantalum, etc., and/or other processes including focused ion beam (FIB) welding, any of various thin film deposition techniques such as e-beam deposition, thermal evaporation, sputtering, chemical vapor deposition, atomic layer deposition, etc.

In certain embodiments, the support member 208 and/or the mounting member 216 can be made of any electrically conductive, high temperature material, such as any of various metals having a relatively high melting point. Non-limiting examples include tungsten (W) (e.g., polycrystalline tungsten), molybdenum (Mo), tantalum (Ta), rhenium (Re), niobium (Nb), etc., and/or combinations or alloys of such metals.

Figure 4:
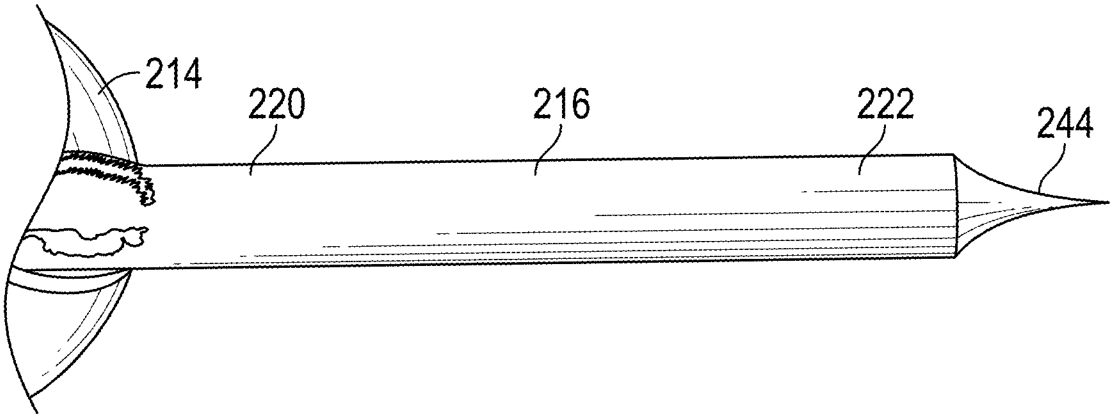
FIG. 4 is a side view of the mounting member of FIG. 2 before formation of a bore and channels.

FIGS. 4-9 illustrate a representative process of making the CPB source 200, according to one embodiment. FIG. 4 illustrates the mounting member 216 mounted to the support member 208 in an unmachined state prior to formation of the bore and the channels. In certain embodiments, the free second end portion 222 of the mounting member 216 can comprise a pointed tip 244. In certain embodiments, the support member 208 and/or the insulative body 202 can be mounted in a suitable fixture, and the bore 226 can be formed by, for example, any of various milling or micromachining techniques such as laser beam machining, focused ion beam milling, etc. The channels 230 can be formed in a similar manner, and/or by other techniques including chemical etching (e.g., wet or dry etching), photolithography, etc.

Figure 6:
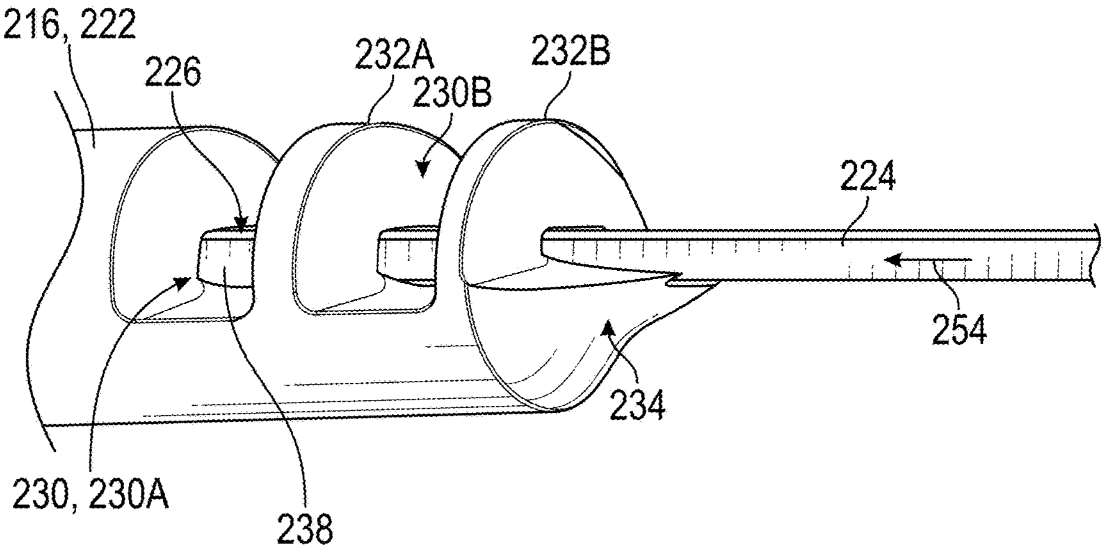
FIG. 6 is a magnified perspective view of the free end portion of the mounting member of FIG. 2 illustrating an emitter member received in the axial bore.

FIG. 5 illustrates the mounting member 216 after formation of the bore 226 and the channels 230. In the illustrated embodiment, a portion of the pointed tip 244 (FIG. 4) can be partially milled away to form the cradle portion 234 and the projections 248-252. In other embodiments, the pointed tip 244 be kept unmilled, or can be milled away completely. Referring to FIG. 6, the emitter member 224 can then be inserted into the bore 226 in the direction of arrow 254, using, for example, a micromanipulator. When received in the bore, the retaining portions 232A and 232B can extend around or over the emitter member 224 such that the emitter member is surrounded by material of the mounting member at the locations of the retaining portions.

Figure 8:
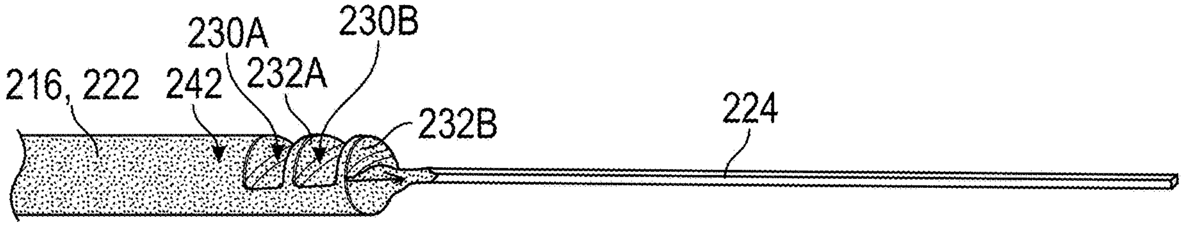
FIG. 8 is a perspective view of the free end portion of the mounting member and the emitter member of FIG. 2 before shaping of the emitter member.

Referring to FIG. 7, the emitter member 224 can then be secured in place by applying the fixative material layer 242. In certain embodiments, the fixative material layer 242 can be applied in a liquid state (e.g., injected using a pipette), as in the case of colloidal graphite. The colloidal liquid can flow around and through the channels 230, into the bore 226 (FIG. 5), and around the emitter member 224 such that the emitter member 224 and the interior surfaces of the bore are wetted by the colloidal liquid along substantially the entire length of the bore 226. The liquid medium or phase of the colloidal liquid can be allowed to evaporate, leaving the fixative material layer (e.g., a graphite layer) coating/covering/encapsulating/encasing the surfaces of the emitter member, the bore, and the mounting member to hold the emitter member 224 in place. In certain embodiments, the fixative material layer 242 can fill in gaps or cavities between the emitter member 224 and the oversized bore 226, as shown in FIGS. 7 and 8. In certain embodiments, the fixative material layer 242 and the mounting member 216 can bond/fuse/weld together at high temperature to further aid in securing the emitter member 224 to the mounting member, such as in embodiments in which the fixative material layer comprises carbon or graphite and the mounting member comprises tungsten. Such fusing or welding can occur during normal microscope operation and/or during a break-in period in which the assembly is heated.

Figure 9:
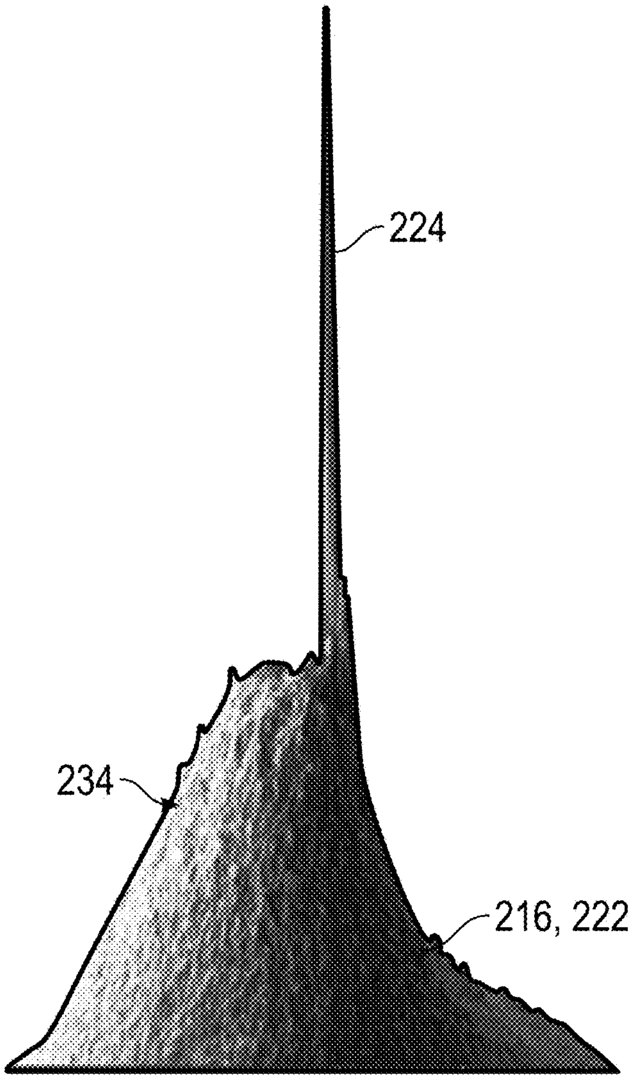
FIG. 9 is a magnified perspective view of the free end portion of the mounting member and the emitter member of FIG. 2 illustrating the emitter member configured as a cold field emitter, according to one embodiment.
Figure 10:
FIG. 10 is a magnified perspective view of a portion of the emitter member of FIG. 9.

FIG. 8 illustrates the emitter member 224 secured to the mounting member 216. In certain embodiments, the emitter member 224 can then undergo additional processing or shaping steps for operation as a cold field emitter, a Schottky emitter, etc. For example, in certain embodiments the emitter member 224 can be shortened such that it extends a specified distance beyond the mounting member 216 (e.g., 200 μm in certain embodiments). In certain embodiments the tip or free end portion of the emitter member 224 can also be shaped/machined/milled to a point or other specified shape, depending upon the particular characteristics desired. For example, FIGS. 9 and 10 illustrate the emitter member 224 configured as a pyramid (FIG. 9) and a nanorod (e.g., cylindrical or substantially cylindrical) (FIG. 10). Such emitters can be configured to operate as cold field emitters or Schottky emitters.

Figure 12:
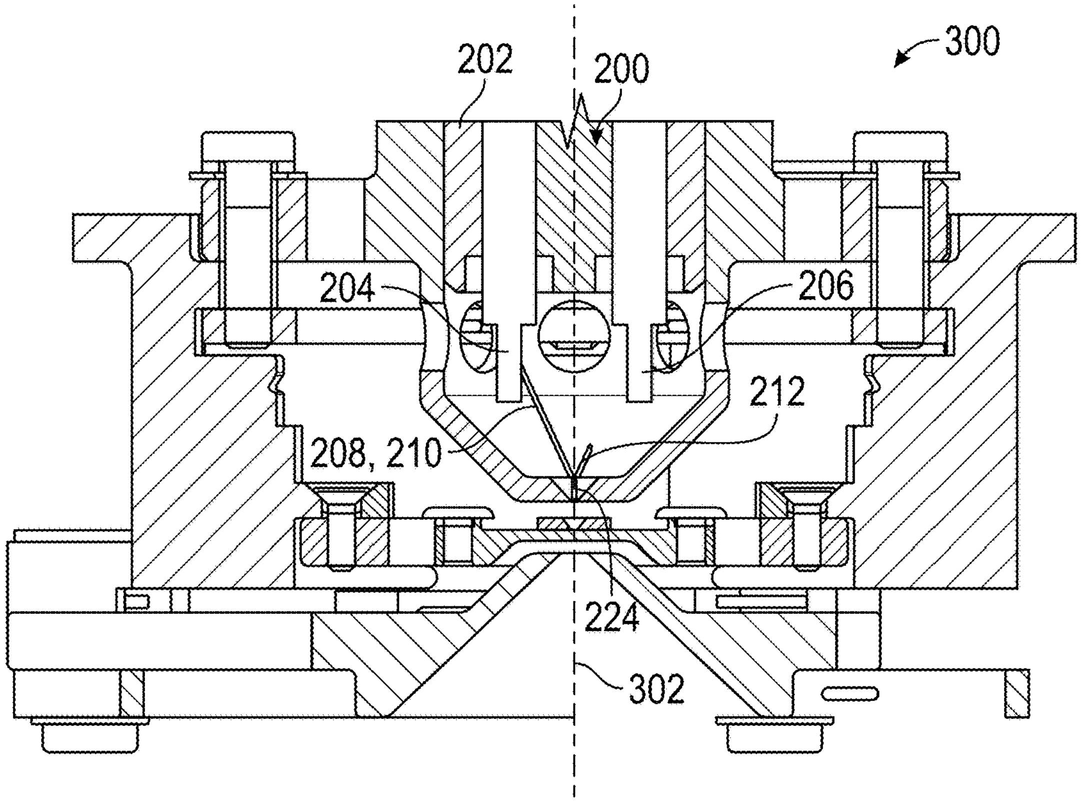
FIG. 12 is a cross-sectional view showing the charged particle beam source of FIG. 2 mounted in a portion of a charged particle microscope, according to one embodiment.

FIG. 12 illustrates a cross-sectional view of the CPB source 200 mounted in a charged particle microscope 300, which can be configured according to any of the CPB systems described herein. When mounted in the microscope 300, the emitter member 224 can be precisely aligned along the particle-optical axis 302 of the microscope. By electrically biasing and/or heating (e.g., by flowing a current through the support member 208) the emitter member 224 (depending on whether the emitter is configured as a cold field emitter or a Schottky emitter), the emitter member 224 can emit a beam of charged particles, which can be manipulated and focused by various elements of the beam column as described above. In FIG. 12, only the portion of the second portion 212 of the support member 208 that is located behind the plane of the cross-section is visible.

One or more of the embodiments described herein can provide significant advantages over existing CPB sources. For example, inserting an emitter member into a bore of a mounting member and securing the emitter member in place by flowing a fixative material into the bore allows the fabrication of significantly smaller CPB sources than is possible using traditional Vogel mounts. The mounting members 216 of the CPB sources described herein can be a few tens of micrometers in diameter or less, while comparable Vogel mounts may require a tungsten base mount or clamping member having a diameter or major dimension of a few hundred micrometers up to a few millimeters. Accordingly, the beam-generating portions of CPB sources configured as described herein can be ten times smaller than comparable CPB sources including Vogel mounts. This can also reduce the electrical current requirements for heating the emitter filament to its operating temperature, resulting in a corresponding improvement in thermal stability.

Additionally, the time required to produce the CPB sources described herein can be significantly reduced as compared to existing sources, while providing equal or superior performance. More particularly, because the bore 226 can be formed in precise alignment with the axis of the mounting member 216, the emitter member 224 can be precisely aligned with this axis automatically when received in the bore, and complex alignment procedures and fixtures are not required. Moreover, because the emitter member is not clamped or held in place by compressive force applied by the support structure as in a Vogel mount, the complexity of mounting the emitter member 224, along with the time required, can also be significantly reduced. In particular, the CPB source configurations described herein do not require that clamping members of the support structure be spread apart to receive the emitter filament, nor that members such as graphite sheets be placed between the clamping members and the emitter filament, all of which complicate assembly and alignment.

Additionally, any or all of the bore formation, the channel formation, the emitter member placement, and/or the application of the fixative material layer can be done in ambient laboratory conditions (e.g., "in air"), and need not be performed under vacuum. This can significantly decrease the time required to manufacture the CPB source 200 compared to existing beam sources, especially those which require FIB welding or fixation of components under vacuum. The manufacture of the CPB sources described herein can also be automated and/or implemented at commercial scale.

CPB sources having the construction described herein have been heated to a temperature of 2200 K for about one hour at a pressure of $10^{-6}$ torr in charged particle microscopes, and substantially no mechanical drift or material loss from the fixative material layer have been observed, indicating that the CPB source embodiments described herein are robust and reliable.

The CPB sources described herein can be used in any of a variety of charged particle beam systems, such as the SEMs, TEMs, or STEMs described above, including multi-beam systems in which such microscopes are combined with other beam columns such as focused ion beam (FIB) mills.

Figure 13:
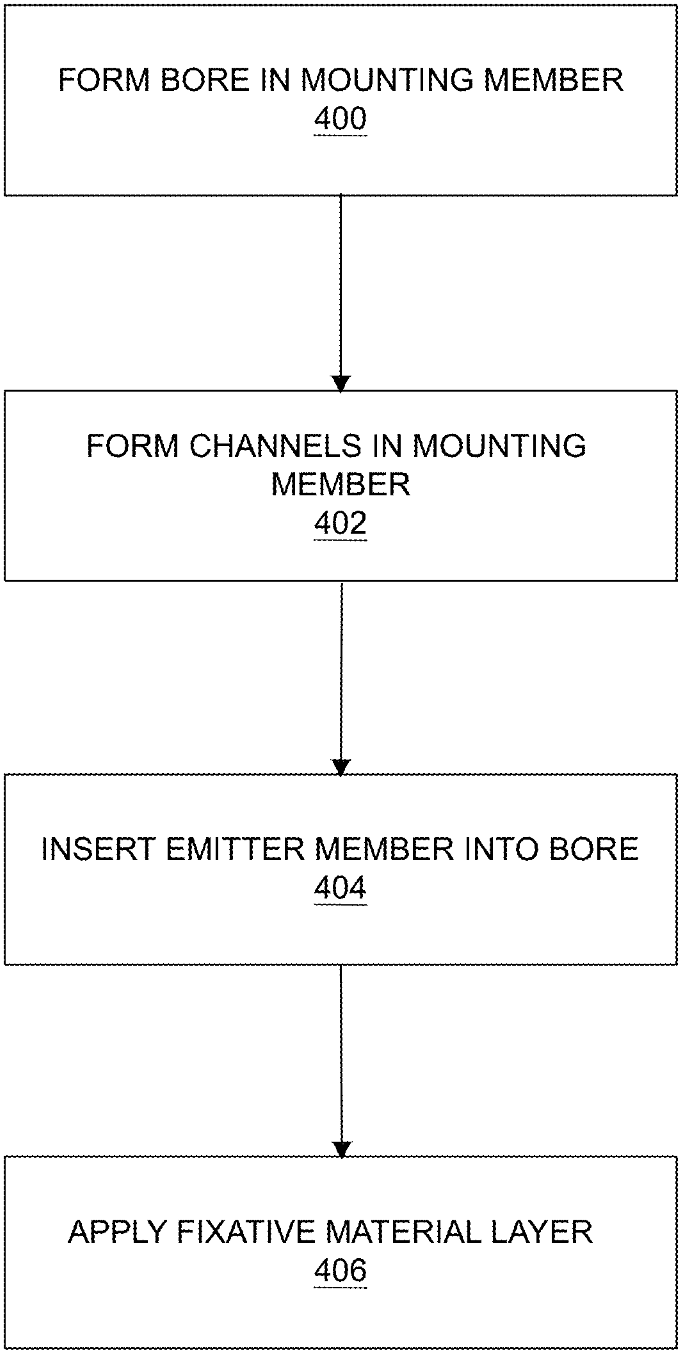
FIG. 13 is a process flow diagram illustrating a method of making a charged particle beam source, according to one embodiment.

FIG. 13 illustrates a representative method of making the CPB source 200. At process block 400, with the base member 202 mounted in a chuck or fixture, the bore 226 can be formed in the mounting member 216, for example, with a pulsed or continuous wave, focused or unfocused laser beam. At process block 402, the openings/apertures/channels 230 can be formed in the free second end portion 222 of the mounting member 216, for example, by a pulsed or continuous wave, focused or unfocused laser beam, etching, or photolithographic process. At process block 404, with the base member 202 held in one fixture and the emitter member 224 held in another fixture such as a micromanipulator, the emitter member can be aligned with and inserted into the bore 226. At process block 406, the fixative material layer 242 can be applied, such as by pipetting a colloidal graphite liquid onto the free second end portion 222 of the mounting member such that the liquid flows through the channels 230 into the bore 226 and around the emitter member 224 to coat the surfaces of the emitter member, the bore, the retaining portions, and other portions of the mounting member. When the liquid phase of the colloidal liquid has evaporated, further shaping of the emitter member 224 can be performed, depending upon the particular requirements of the CPB system in which the source is to be used. Alternatively, the fixative material layer can be applied in other ways such as by thin film deposition, etc., as noted above.

Explanation of Terms

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items.

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth herein. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and/or apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

In some examples, values, procedures, or apparatus are referred to as "lowest", "best", "minimum," or the like. It will be appreciated that such descriptions are intended to indicate that a selection among many used functional alternatives can be made, and such selections need not be better, smaller, or otherwise preferable to other selections.

Certain examples may be described with reference to directions indicated as "above," "below," "upper," "lower," and the like. These terms are used for convenient description, but do not imply any particular spatial orientation.

Although there are alternatives for various components, parameters, operating conditions, etc., set forth herein, that does not mean that those alternatives are necessarily equivalent and/or perform equally well. Nor does it mean that the alternatives are listed in a preferred order unless stated otherwise.

In view of the many possible embodiments to which the principles of the disclosed technology may be applied, it should be recognized that the illustrated embodiments are only examples and should not be taken as limiting the scope of the disclosure. Rather, the scope of the disclosure is at least as broad as the following claims and equivalents of the features recited therein. We therefore claim all that comes within the scope and spirit of these claims.

The invention claimed is:

1. A charged particle beam source, comprising:

a mounting member coupled to and extending from a curved, electrically conductive hairpin member, the mounting member defining a first opening at a free end of the mounting member and a bore extending from the first opening into the mounting member along a longitudinal axis of the mounting member;

a second opening defined in a side wall of the mounting member and extending between an outer surface of the mounting member and the bore, the second opening being spaced apart from the first opening along the longitudinal axis of the mounting member;

an emitter member received in the bore and aligned along the longitudinal axis of the mounting member; and a fixative material received in the bore and in the second opening to retain the emitter member in the bore.

2. The charged particle beam source of claim 1, wherein the fixative material curves around and at least partially coats an exterior surface of the mounting member.

3. The charged particle beam source of claim 1, wherein the emitter member extends beyond the second opening in the side wall of the mounting member in a direction toward the hairpin member.

4. The charged particle beam source of claim 1, wherein the second opening comprises a channel or slot.

5. The charged particle beam source of claim 1, wherein the second opening is one of a plurality of second openings arrayed about a circumference of the mounting member.

6. The charged particle beam source of claim 1, wherein the fixative material coats interior surfaces of the bore and extends around and covers the emitter member in the bore.

7. The charged particle beam source of claim 1, wherein the emitter member comprises lanthanum hexaboride ($LaB_6$) or cerium hexaboride ($CeB_6$).

8. The charged particle beam source of claim 1, wherein the fixative material comprises graphite.

9. A scanning electron microscope comprising the charged particle beam source of claim 1.

10. A method of making the charged particle beam source of claim 1, comprising:

forming the bore in the mounting member;

inserting the emitter member into the bore in the mounting member; and flowing a colloidal liquid around the emitter member and the mounting member to form the fixative material.

11. A method of using the charged particle beam source of claim 1, comprising:

heating the emitter member to generate a charged particle beam; and directing the charged particle beam at a target.

12. A charged particle beam source, comprising:

a curved hairpin member comprising an electrically conductive material;

a mounting member coupled to and extending from an apex of the hairpin member such that a longitudinal axis of the mounting member is aligned with the apex of the curved hairpin member, the mounting member further comprising a free end portion;

a bore defined in the mounting member and extending along the longitudinal axis of the mounting member, the bore comprising an opening at the free end portion of the mounting member;

an emitter member received in the bore and aligned along the longitudinal axis of the mounting member;

a fixative material layer that coats interior surfaces of the bore and extends around and covers the emitter member in the bore;

wherein the emitter member comprises lanthanum hexaboride ($LaB_6$) or cerium hexaboride ($CeB_6$), the mounting member comprises tungsten, the fixative material comprises graphite, and the graphite fixative material and the tungsten mounting member are welded together to secure the emitter member in the bore.

13. The charged particle beam source of claim 12, wherein:

the opening at the free end portion of the mounting member is a first opening; and the mounting member further comprises a second opening defined in a side wall of the mounting member and extending between an outer surface of the mounting member and the bore, the second opening being spaced apart from the first opening along the longitudinal axis, and wherein the fixative material layer is received in the second opening.

14. The charged particle beam source of claim 13, wherein the emitter member extends beyond the second opening in the side wall of the mounting member in a direction toward the hairpin member.

15. The charged particle beam source of claim 12, wherein the fixative material layer curves around and at least partially coats an exterior surface of the mounting member.

16. A charged particle beam source, comprising:

a curved hairpin member comprising an electrically conductive material;

a mounting member coupled to and extending from an apex of the hairpin member and defining an opening at a free end of the mounting member, the mounting member further comprising a bore extending from the opening into the mounting member along a longitudinal axis of the mounting member;

an emitter member received in the bore and aligned along the longitudinal axis of the mounting member; and a fixative material received in the bore to retain the emitter member in the bore;

wherein the emitter member comprises lanthanum hexaboride ($LaB_6$) or cerium hexaboride ($CeB_6$), the mounting member comprises tungsten, the fixative material comprises graphite, and the graphite fixative material and the tungsten mounting member are welded together to secure the emitter member in the bore; and wherein the emitter member is not clamped by the mounting member.

17. The charged particle beam source of claim 16, wherein:

the opening at the free end of the mounting member is a first opening; and the mounting member further comprises a second opening defined in a side wall of the mounting member and extending between an outer surface of the mounting member and the bore, the second opening being spaced apart from the first opening along the longitudinal axis, and wherein the fixative material is received in the second opening.

18. The charged particle beam source of claim 16, wherein the fixative material coats interior surfaces of the bore and extends around and covers the emitter member in the bore.

19. The charged particle beam source of claim 1, wherein:

the mounting member comprises tungsten;

the fixative material comprises graphite; and the graphite fixative material and the tungsten mounting member are fused together to secure the emitter member in the bore.

20. The charged particle beam source of claim 12, wherein the emitter member is not clamped by the mounting member.

* * * * *